(12) United States Patent
Choi et al.

(10) Patent No.: US 9,015,015 B2
(45) Date of Patent: Apr. 21, 2015

(54) SYSTEM FOR SUPPORTING ROBOT HARDWARE DESIGN AND METHOD THEREOF

(75) Inventors: Mu Sung Choi, Gunpo-si (KR); Kwang Woong Yang, Anyang-si (KR); Eun Chol Shin, Ansan-si (KR); Hong Seok Kim, Seoul (KR)

(73) Assignee: Korea Institute of Industrial Technology (KR)

( * ) Notice: Subject to any disclaimer, the term of this patent is extended or adjusted under 35 U.S.C. 154(b) by 395 days.

(21) Appl. No.: 13/513,417

(22) PCT Filed: Dec. 1, 2010

(86) PCT No.: PCT/KR2010/008558
§ 371 (c)(1),
(2), (4) Date: Jul. 2, 2012

(87) PCT Pub. No.: WO2011/068356
PCT Pub. Date: Jun. 9, 2011

(65) Prior Publication Data
US 2012/0265498 A1   Oct. 18, 2012

(30) Foreign Application Priority Data
Dec. 2, 2009 (KR) .......................... 10-2009-0118255

(51) Int. Cl.
*G06G 7/48* (2006.01)
*G06F 17/50* (2006.01)
*G05B 19/4097* (2006.01)
*G05B 15/02* (2006.01)

(52) U.S. Cl.
CPC ............ *G06F 17/50* (2013.01); *G05B 19/4097* (2013.01); *G05B 15/02* (2013.01)

(58) Field of Classification Search
None
See application file for complete search history.

(56) References Cited

U.S. PATENT DOCUMENTS 7,324,872 B2 * 1/2008 Nagasaka ...................... 700/245
7,657,345 B2 * 2/2010 Endo et al. .................... 700/249
(Continued)

FOREIGN PATENT DOCUMENTS

JP    2013-512522    4/2013
KR    10-2005-0018894    2/2005
(Continued)

OTHER PUBLICATIONS

Park et al. KR 10-0738052, Jul. 12, 2007.*
Kim et al. KR 10-2009-0093142 Sep. 2009.*
(Continued)

*Primary Examiner* — Omar Fernandez Rivas
*Assistant Examiner* — Cuong Luu
(74) *Attorney, Agent, or Firm* — Ballard Spahr LLP

(57) ABSTRACT

The present invention relates to a system and a method for supporting robotic hardware design, and the method comprises: loading a template which has information on the mechanical structure, operating mechanism, power transmission and motion data of robot modules; modifying the information for use in a simulator for further designing the robot modules; analyzing the behavior of each robot module according to respective motion data; applying the resulting data to modify each robot module according to simulation API; and controlling the selection/combination of robot parts for simulator assembly according to API and the resulting templates, databases on which robot parts are required and databases for information on selection/combination of robot parts and assembly of each robot module. The above system and method provide an optimal way to design robot hardware and reduce the time required for robot hardware design.

6 Claims, 4 Drawing Sheets

(56) References Cited

U.S. PATENT DOCUMENTS

| | | |
|---|---|---|
| 2005/0113973 A1* | 5/2005 | Endo et al. .................... 700/245 |
| 2007/0219933 A1* | 9/2007 | Datig ................................ 706/4 |
| 2012/0259429 A1* | 10/2012 | Han et al. ........................ 623/24 |
| 2013/0057004 A1* | 3/2013 | Murata et al. ................. 294/106 |

FOREIGN PATENT DOCUMENTS

| | | |
|---|---|---|
| KR | 10-0738052 | 7/2007 |
| KR | 10-2009-0093142 | 9/2009 |
| WO | 2011/068356 | 6/2011 |

OTHER PUBLICATIONS

International Search Report and Written Opinion issued Jul. 27, 2011 for International Patent Application No. PCT/KR2010/008558, which was filed on Dec. 1, 2010 and published as WO 2011/068356 on Jun. 9, 2011 (Inventor—Choi; Applicant—Korea Institute of Industrial Technology) (pp. 1-8).

International Preliminary Report on Patentability issued Jun. 12, 2012 for International Patent Application No. PCT/KR2010/008558, which was filed on Dec. 1, 2010 and published as WO 2011/068356 on Jun. 9, 2011 (Inventor—Choi; Applicant—Korea Institute of Industrial Technology) (pp. 1-7).

* cited by examiner

PRIOR ART

SYSTEM FOR SUPPORTING ROBOT HARDWARE DESIGN AND METHOD THEREOF

CROSS-REFERENCE TO RELATED PATENT APPLICATIONS

The present application is a National Phase Application of International Application No. PCT/KR2010/008558, filed Dec. 1, 2010, which claims the benefit of Korean Patent Application No. 10-2009-0118255, filed Dec. 2, 2009, which applications are incorporated herein fully by this reference.

TECHNICAL FIELD

The present invention relates to robot hardware design support and, more particularly, to a system and method for supporting robot hardware design which can reduce the time and cost of conceptual design and detailed design in the production of a robot when robot modules and platforms are built using common parts.

BACKGROUND ART

In general, robots are classified into industrial, medical, space, and submarine robots and applied in various fields. For example, the industrial robots that repeat the same movements are used in the machining industry such as automobile production. In the medical field, a prosthetic hand that drives a motor by myogenic potentials evoked by an armless person's intention, i.e., a command from motor nerve is commercialized. In the field of space development, remote control robots such as moon crawlers have been developed in the USA and Russia.

To design these robots, it is necessary to establish a goal of developing a desired robot and determine general schematic specifications and structure. In a conceptual design phase, a dynamic simulation is performed, and then a detailed design phase is underway to draw up detailed specifications and select parts.

An example of a process to produce the robot is shown in FIG. 1. FIG. 1 is a flowchart showing a conventional process of robot development.

As shown in FIG. 1, a robot production plan that meets the development goals is established (S11), and then a scenario is created (S12). After the above step S12, hardware is designed and produced (S13) and, at the same time, a running program is produced (S15). Then, the produced hardware is tested (S14) and, if a normal result is obtained, the running program is mounted in the hardware (S16). After the running program is mounted in the hardware, a test is performed to determine whether the robot normally operates (S17) and, if it is determined that the robot normally operates, the current circuit design and mechanical design are determined as a model for mass production, and a robot for mass production is prepared (S18).

The planning of the robot production, the creation of the scenario, etc. have fixed periods depending on the goals or requirements of robot development. The design/production of the hardware, the production of the running program, etc. generally require a long time while there are some differences depending on the technical difficulties. In particular, the conventional robot hardware is designed using a design tool such as CAD, for example, which requires specialized design techniques, resulting in reduced accessibility. Moreover, this design tool is not specialized for the robot design, and thus it is difficult to professionally design the robot only. Furthermore, there is a lack of standard parts, systematic performance test data, etc. for the robot development, and thus it is also difficult to optimally design the robot using various parts.

DISCLOSURE

Technical Problem

Accordingly, the present invention has been made to solve the above-described problems associated with prior art. An object of the present invention is to provide a system and method for supporting robot hardware design which can easily design robot hardware by providing a template having various structures, mechanisms, and power transmission systems of respective modules such as a mobile module, an arm module, a head module, etc. that constitute the robot.

Another object of the present invention is to provide a system and method for supporting robot hardware design which can optimally design a robot by determining the specifications of each robot joint through analysis, determining the specification of parts that meet the requirements, and selecting parts.

Technical Solution

According to a system for supporting robot hardware design in accordance with an exemplary embodiment of the present invention to achieve the above objects, the system comprises: a template which contains information on the mechanical structure, operating mechanism, power transmission system, and motion data of a robot module to be used by a simulator for designing the robot module; a simulator application programming interface (API) which loads the template, modifies the information, analyzes the movements of the robot module based on the motion data, and utilizes result data required for each joint of the robot module; a part database which contains information on parts required for the production of the robot module based on the analysis results of the simulator; a part selection/combination unit which selects and combines parts required for the production of the robot module from the part database; and a control unit which controls the simulator, the template, the simulator API, the part database, and the part selection/combination unit.

According to the system for supporting robot hardware design in accordance with an exemplary embodiment of the present invention, the system further comprises a database input unit which updates the information on the parts required for the production of the robot module.

According to the system for supporting robot hardware design in accordance with an exemplary embodiment of the present invention, the robot module comprises at least module selected from the group consisting of a mobile module, an arm module, and a head module.

According to the system for supporting robot hardware design in accordance with an exemplary embodiment of the present invention, the result data comprises torque and speed required for each joint of the mobile module, the arm module, and the head module.

According to a method for supporting robot hardware design in accordance with an exemplary embodiment of the present invention to achieve the above objects, the method comprises: (i) a step of driving a simulator for designing a robot module; (ii) a conceptual design step of recommending the structure and mechanism of each of robot modules including a mobile module, an arm module, and a head module, providing motion data of the recommended robot module, and determining the specifications of parts applied to the robot module; and (iii) a detailed design step of providing parts that meet the specifications of the parts determined in step (ii) and selecting a combination of the provided parts.

According to the method for supporting robot hardware design in accordance with an exemplary embodiment of the present invention, the above step (ii) comprises: (iv) a step of selecting at least one from the robot modules including the mobile module, the arm module, and the head module; (v) a step of providing a template containing information on the mechanical structure, operating mechanism, power transmission system, and motion data of the selected at least one robot module to be used by the simulator; and (vi) a step of determining the specifications of the selected at least one robot module from the template.

According to the method for supporting robot hardware design in accordance with an exemplary embodiment of the present invention, the above step (iii) comprises: (vii) a step of determining whether the specifications of the selected at least one robot module are suitable for the design of a robot module to be produced; and (viii) a step of selecting parts corresponding to the determined specifications if it is determined that the specifications are suitable for the design in step (vii).

According to the method for supporting robot hardware design in accordance with an exemplary embodiment of the present invention, the method further comprises, if it is determined that the specifications of the selected at least one robot module are not suitable for the design of the robot module to be produced in step (vii), a step of determining again the specifications of the module from the template.

Advantageous Effects

As described above, according to the system and method for supporting robot hardware design in accordance with the exemplary embodiments of the present invention, it is possible to easily design the hardware of a robot by providing a template having various structures, mechanisms, and power transmission systems of respective modules including a mobile module, an arm module, a head module that constitute the robot.

Moreover, according to the system and method for supporting robot hardware design in accordance with the exemplary embodiments of the present invention, it is possible to optimally design the robot by determining the specifications of each robot joint through analysis, determining the specification of parts that meet the requirements, and selecting parts.

MODE FOR INVENTION

Figure 1:
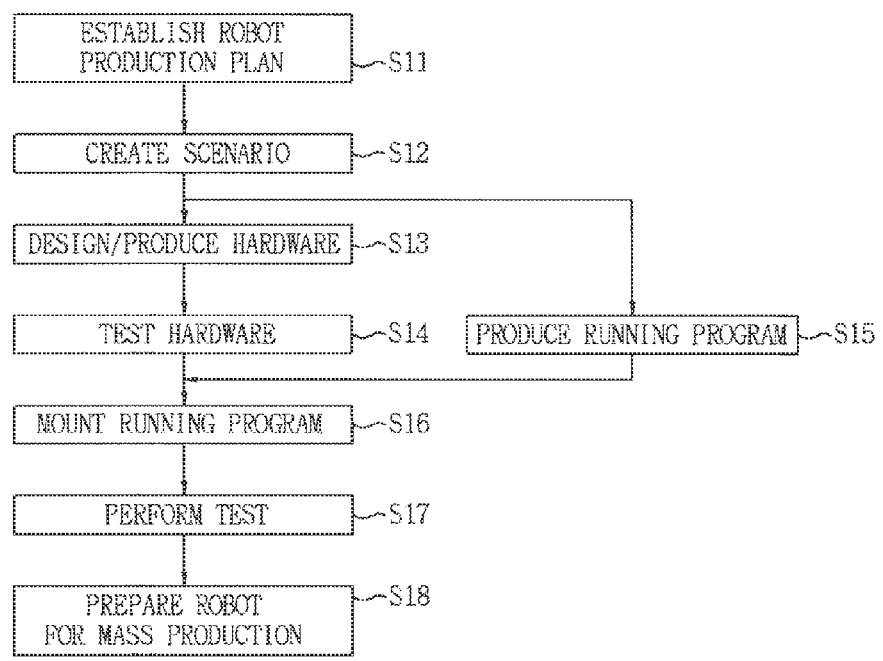
FIG. 1 is a flowchart showing a conventional process of robot development.
Figure 2:
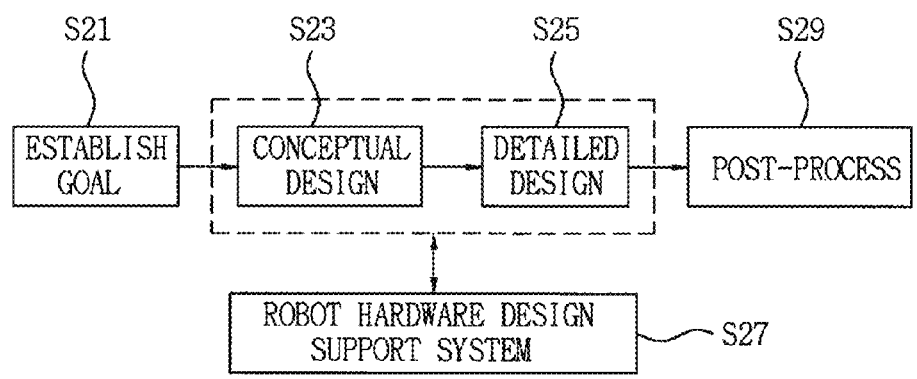
FIG. 2 is a diagram showing the concept of a robot hardware design support system in accordance with an exemplary embodiment of the present invention.

The above and other objects and novel characteristics of the present invention will be more apparent from the description of the present specification and the accompanying drawings. First, the concept of the present invention will be described with reference to FIG. 2. FIG. 2 is a diagram showing the concept of a robot hardware design support system in accordance with an exemplary embodiment of the present invention.

As shown FIG. 2, in order to design a robot, a goal in accordance with the purpose and intended use should be established (S21). When the goal of developing the robot is established in the above step S21, general structure and specifications of the robot are determined as a conceptual design (S23). The general structure and specifications determined in the above step S23 are verified through dynamic simulation and reflected in the conceptual design. Then, the specifications of parts are selected as a detailed design, and a combination of parts is recommended (S25). The above step S25 is completed with modification through structural analysis.

In this case, the conceptual design phase and the detailed design phase can be completed by the robot hardware design support system (S27). The design support system provides a template having various structures, mechanisms, and power transmission systems of respective modules including a mobile module, an arm module, a head module, etc. in the conceptual design phase, and determines the specifications of joints that constitute the module by analyzing the provided template. Moreover, the design support system selects parts that can meet the specifications of each joint in the detailed design phase and determines a possible combination of the parts.

The operation of selecting and determining the parts uses parts from several manufacturers pre-built in a product database and provides information on each of the parts selected from the manufacturers and evaluation results for the combination of the parts. For example, when parts for an arm module are selected, the design support system selects a specific manufacturer and a specific product with respect to each of motors, decelerators, sensors, etc. used in the arm module and provides the evaluation results for the combination of the parts.

When the detailed design is completed by the design support system, a post-process is performed (S29). In the post-process, the parts of each robot module are processed and assembled, and a running program is mounted in the assembled robot and subjected to a test phase. Data obtained in the test phase is reflected again in the conceptual design and the detailed design and, when the specifications of each module suitable for achieving the goals are determined, the robots are produced in mass production.

Next, the configuration of the present invention will be described with reference to FIG. 3. In the description of the present invention, the same elements are denoted by the same reference numerals, and repeated description thereof will be omitted.

Figure 3:
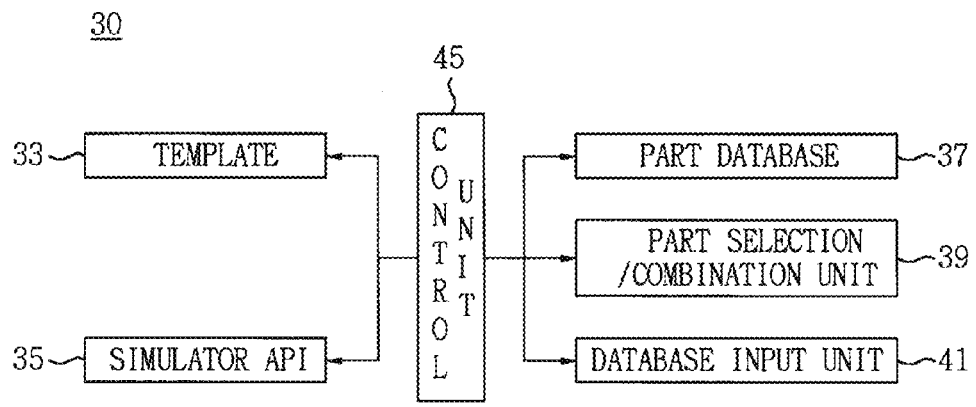
FIG. 3 is a diagram showing the configuration of a robot hardware design support system in accordance with an exemplary embodiment of the present invention.

FIG. 3 is a diagram showing the configuration of a robot hardware design support system in accordance with an exemplary embodiment of the present invention.

As shown in FIG. 3, a robot hardware design support system 30 in accordance with an exemplary embodiment of the present invention comprises a template 33 configured in the form of data used by a simulator (not shown) that uses a predetermined or standard application programming interface (API) for the robot design, a simulator API 35, a part database 37, a part selection/combination unit 39, a database input unit 41, and a control unit 45.

The template 33 is configured in the form of data used by the simulator and contains information on the mechanical structure, mechanism, power transmission system, and motion data of the robot module. In this case, the analysis performed on the simulator means the acquisition of various necessary dynamic data by virtually performing the main movements or extreme movements of the robot. Moreover, the basic motion data for the analysis means movement samples such as position, speed, etc. at each joint over time. The movement samples may be simple trajectories in an open-loop control system or may be trajectories calculated by the controller in a closed-loop control system.

The template 33 may be loaded in the simulator to change physical properties such as the size, mass, friction, inertia moment, etc. of each robot module. Moreover, the template 33 may provide various examples for achieving the respective target functions in a mobile function module, an operation function module, a recognition function module, etc.

The simulator API 35 loads and modifies the template 33, allows the robot module to perform its movements based on the basic motion data, and analyzes the performed movements, thus utilizing result data such as torque, speed, etc. required for each joint. The part database 37 contains information on basic specifications, manufacturers, simple evaluation results, and combinable configurations of parts. Moreover, the part database 37 may update the information on the specifications of the parts online or offline and may be built on a web for sharing, etc.

The part selection/combination unit 39 has an algorithm for combining the parts depending on various combination criteria such as size minimization, cost minimization, reliability, etc. of a combined module. The database input unit 41 may be connected to a part manufacturer or vendor so as to add or modify the information on the parts. Thus, the part manufacture or vendor may update the information on the corresponding parts in the part database 37 built online, and the information is registered in the part database 37 upon final approval by a database manager.

The control unit 45 controls the simulator, the template 33, the simulator API 35, the part database 37, and the part selection/combination unit 39 to optimize the conceptual design and detailed design process of the robot, thus reducing the development time of the robot hardware.

Figure 4:
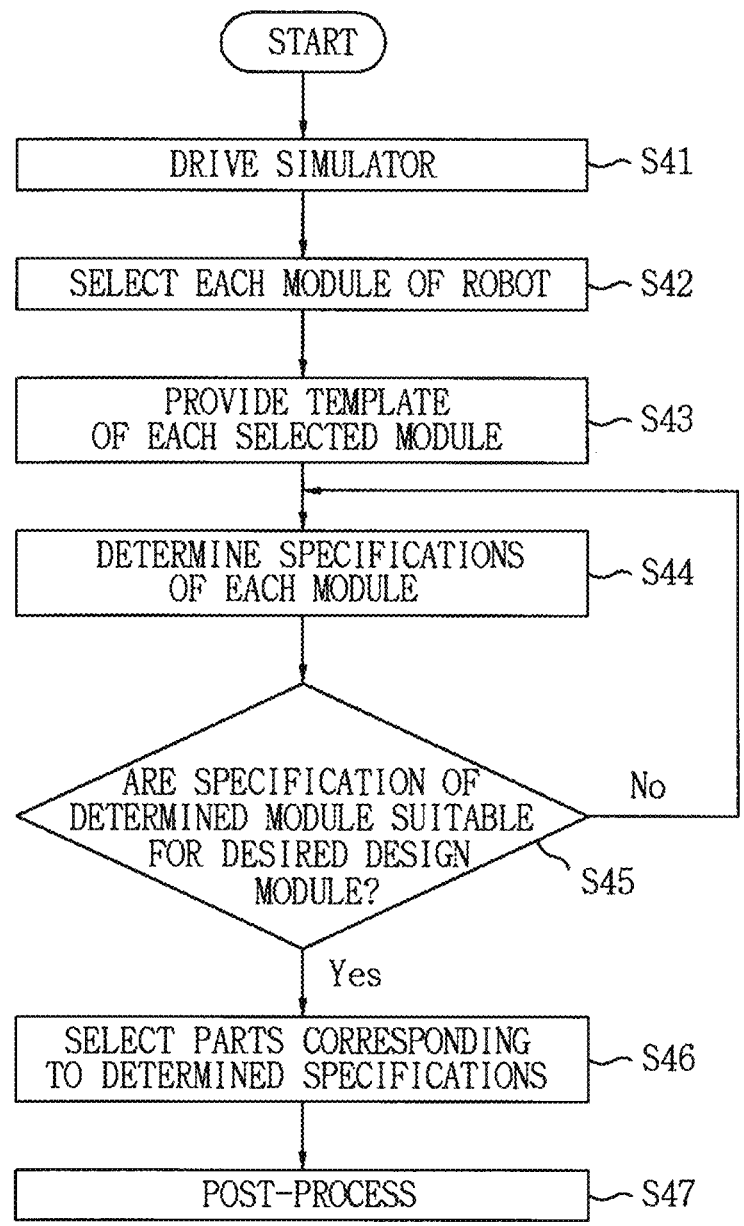
FIG. 4 is a flowchart showing an example of a robot hardware design support method in accordance with another exemplary embodiment of the present invention.

Next, a robot hardware design support method in accordance with another exemplary embodiment of the present invention will be described with reference to FIGS. 4 to 5. FIG. 4 is a flowchart showing an example of a robot hardware design support method in accordance with another exemplary embodiment of the present invention, and FIG. 5 is a diagram showing an example of robot design using the design support system in accordance with the exemplary embodiment of the present invention.

Figure 5:
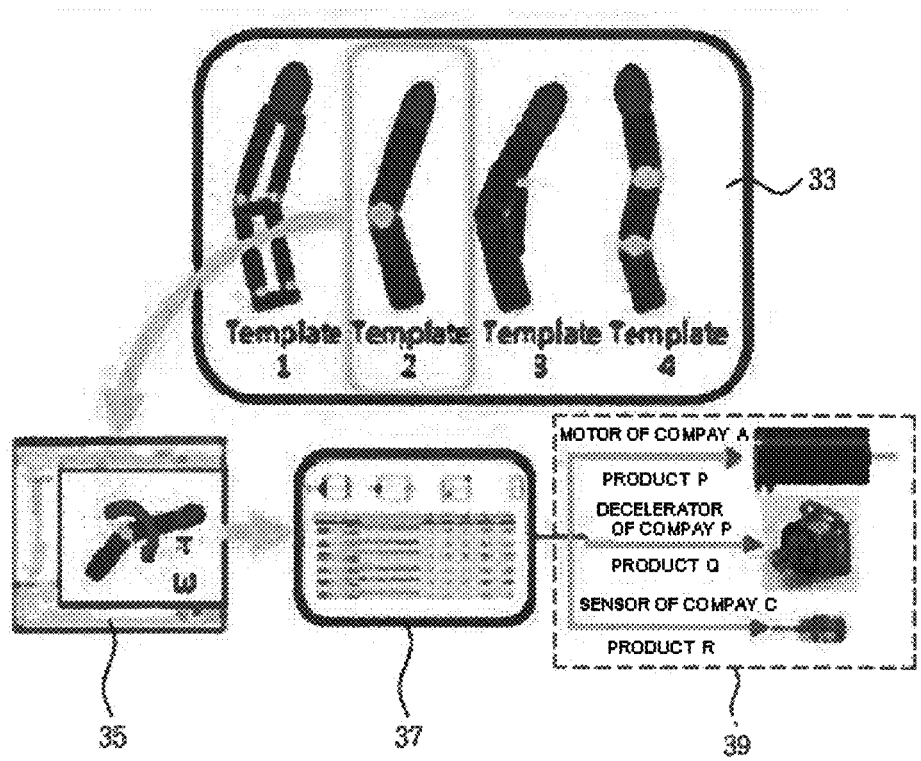
FIG. 5 is a diagram showing an example of robot design using the design support system in accordance with the exemplary embodiment of the present invention.

As shown in FIGS. 4 to 5, the robot hardware design support method in accordance with another exemplary embodiment of the present invention starts from a step of driving a simulator that uses a predetermined or standard API for the robot design (S41). The simulator may use other platforms well known in the art as well as the above-described OPRoS.

After the above step S41, at least one is selected from the robot modules including a mobile module, an arm module, and a head module (S42) and provides a template 33 containing information on the mechanical structure, operating mechanism, power transmission system, and motion data of each of the selected robot modules including the mobile module, the arm module, and the head module (S43). Moreover, after the above step 43, the specifications of at least one module selected by the template 33 are determined (S44).

FIG. 5 shows a conceptual design and detailed design process using the robot hardware design support system when the development goal is a child English education robot. In this case, the detailed goals are to develop a robot that has a wheel-driven child-friendly animal shape with simple motion type arms of human scale and comprises a mobile body with a live load of about 30 kg.

The conceptual design recommends the structure and mechanism of each of the robot modules including the mobile module, the arm module, and the head module that meet the detailed goals, provides basic motion data of the recommended robot modules, adjusts parameters of the provided templates into desired scales, and determines the specifications of each joint through analysis. Moreover, the detailed design provides parts that can meet the specifications of each joint determined in the conceptual design, and recommends a combination of the provided parts.

Arm modules (templates 1 to 4) of various shapes are provided in the template 33, and template-2 may be selected as a simple motion type arm module of human scale for the detailed goals in the conceptual design phase. Moreover, the simulator API 35 loads and modifies the selected template-2, allows the corresponding module to perform its movements based on the basic motion data, and analyzes the performed movements, thus utilizing result data such as torque, speed, etc. required for each joint. The part database 37 contains information on basic specifications, manufacturers, simple evaluation results, and combinable configurations of the simple motion type arm module.

In the above step S44, parameters of template-2 are adjusted into desired scales and, when optimal specifications are determined through analysis, it is determined whether the determined specifications of each module are suitable for the desired design module (S45). If it is determined that the specifications are suitable for the desired design module, the parts corresponding to the determined specifications are combined and recommended (S46). For example, as shown in FIG. 5, motor P of company A, decelerator Q of company B, and sensor R of company C may be adopted to apply to template-2, the simple motion type arm module of human scale, in the detailed design phase. As a result, when the robot hardware design support system in accordance with the exemplary embodiment of the present invention is applied to the conceptual design and detailed design of the robot, it is possible to reduce the design time of the robot hardware by more than 25% and optimize the design of the robot hardware by utilizing the template, the analysis, and the part database.

If the specifications of each module determined in the above step S45 are not suitable for the desired design module, the determination of the specifications of the module from the template 33 is repeated. After the above step S46, a post-process of drawing, processing, assembling, testing, and manufacturing is performed to produce a robot that meet the goals.

The invention has been described in detail with reference to preferred embodiments thereof. However, it will be appreciated by those skilled in the art that changes may be made in these embodiments without departing from the principles and spirit of the invention, the scope of which is defined in the appended claims and their equivalents.

The invention claimed is:

1. A system for supporting robot hardware design, the system comprising:
    a template, implemented using a processor, said template containing information on the mechanical structure, operating mechanism, power transmission system, and motion data of a robot module to be used by a simulator, implemented on said processor, for designing the robot module;

a simulator application programming interface (API), implemented on said processor which loads the template, modifies the information contained in the template, analyzes movements of the robot module based on the motion data, and generates a specification required for each joint of the robot module;

a part database, implemented using memory associated with said processor, which stores information on parts for the production of a robot;

a part selection/combination unit, implemented on said processor, which selects and combines parts required for the production of the robot module from the part database, wherein the required parts are parts corresponding to the specification of the robot module based on the analysis results of the simulator;

a control unit, implemented on said processor, which controls the simulator, the template, the simulator API, the part database, and the part selection/combination unit;

wherein the movements contain movement samples of a position and a speed at each joint of the robot module over time; and the robot module comprises at least one module selected from the group consisting of a mobile module, an arm module, and a head module.

2. The system of claim 1, further comprising a database input unit associated with said memory and said processor, which updates the information on the parts required for the production of the robot module.

3. The system of claim 1, wherein the result data comprises torque and speed required for each joint of the mobile module, the arm module, and the head module.

4. In a method of supporting robot hardware design by a system for supporting a robot hardware design comprising a template implemented on a processor, said template containing information on mechanical structures, operating mechanisms, power transmission systems, and motion data of robot modules; a simulator, implemented on said processor for loading the template, modifying the information, and analyzing the behavior of each robot module according to respective motion data; and a part database, implemented using memory associated with said processor for storing information on parts required for the production of the robot modules, the method comprising:

(i) a step of driving said simulator, implemented on said processor, for designing the robot modules;

(ii) selecting at least one from the robot modules including the mobile module, the arm module, and the head module stored in said database in said memory associated with said processor;

(iii) providing said template, implemented on said processor, said template containing information on the mechanical structures, the operating mechanisms, the power transmission system, and motion data of the selected at least one robot module to be used by the simulator;

(iv) analyzing, using said processor, movements of the robot modules according to the motion data of the template using the simulator and determining specifications of at least one of the robot modules from the analyzed results by the simulator; and (v) providing, using said processor, parts corresponding to the determined specifications of the robot modules from the part database and selecting a combination of the provided parts;

wherein the movements comprises movement samples containing a position and a speed at each joint of the robot modules over time.

5. The method of claim 4, wherein the step (v) comprises:

(vi) a step of determining, using said processor, whether the determined specifications of the selected at least one robot module are suitable for the design of a robot module to be produced; and (vii) a step of selecting, using said processor, parts corresponding to the determined specifications if it is determined that the determined specifications are suitable for the design in the step (vii).

6. The method of claim 5, further comprising determining, using said processor again the determined specifications of the module from the template, if it is determined that the determined specifications of the selected at least one robot module are not suitable for the design of the robot module to be produced in the step (vii).

* * * * *